United States Patent [19]
Chuang

[11] Patent Number: 6,107,159
[45] Date of Patent: Aug. 22, 2000

[54] METHOD FOR FABRICATING A SHALLOW TRENCH ISOLATION STRUCTURE

[75] Inventor: Shu-Ya Chuang, Hsinchu Hsien, Taiwan

[73] Assignee: United Semiconductor Corp., Hsinchu, Taiwan

[21] Appl. No.: 09/261,094

[22] Filed: Mar. 2, 1999

[30] Foreign Application Priority Data

Jan. 16, 1999 [TW] Taiwan ................. 88100649

[51] Int. Cl.⁷ ..................................... H01L 21/76
[52] U.S. Cl. .......................... 438/432; 438/424; 438/221
[58] Field of Search ..................... 438/424, 432, 438/221

[56] References Cited

U.S. PATENT DOCUMENTS

| | | | |
|---|---|---|---|
| 4,571,819 | 2/1986 | Rogers et al. | 438/424 |
| 4,621,414 | 11/1986 | Iranmanesh | 438/432 |
| 5,116,779 | 5/1992 | Iguchi | 438/432 |
| 5,130,268 | 7/1992 | Liou et al. | 438/432 |
| 5,719,085 | 2/1998 | Moon et al. | 438/424 |
| 5,721,172 | 2/1998 | Jang et al. | 438/424 |
| 5,795,811 | 8/1998 | Kim et al. | 438/424 |
| 5,872,043 | 2/1999 | Chen | 438/424 |
| 5,976,950 | 11/1999 | DiSimmone et al. | 438/432 |
| 6,020,230 | 2/2000 | Wu | 438/432 |

Primary Examiner—Charles Bowers
Assistant Examiner—David S Blum
Attorney, Agent, or Firm—J.C. Patents; Jiawei Huang

[57] ABSTRACT

A method for forming a STI structure is provided. The method contains sequenitially forming a pad oxide layer and a mask layer on a semiconductor substrate. Several trenches in the substrate through the mask layer and the pad oxide layer. The trenches has a wider trench and a narrower trench. A liner oxide layer is formed at each sidewall of the trenches in the substrate. A spacer is formed on each sidewall of the wider trench, in which the narrower trench simultaneously is filled with same insulating material. A conformal polysilicon layer is formed over the substrate, in which the wider trench is not completely filled yet. An insulating plug is formed to fill the wider trench. Using the insulating plug as an etching mask a portion of the polysilicon layer is removed by etching. As a result, a polysilicon pivot sidewall of the remaining polysilicon layer due to etching may occur. The polysilicon pivot sidewall is compensated with polysilicon. The mask layer and the pad oxide layer are removed, and a gate oxide layer is formed instead. During the formation of the gate oxide layer, a surface portion of the polysilicon layer is also oxidized so that the insulating plug and the spacer are merged through the oxidized portion of the polysilicon to form a round isolation structure.

22 Claims, 3 Drawing Sheets

METHOD FOR FABRICATING A SHALLOW TRENCH ISOLATION STRUCTURE

CROSS-REFERENCE TO RELATED APPLICATION

This application claims the priority benefit of Taiwan application serial no. 88100649, filed Jan. 16, 1999, the full disclosure of which is incorporated herein by reference.

BACKGROUND OF FILE INVENTION

1. Field of the Invention:

This invention relates to semiconductor fabrication, and more particularly to a method for fabricating a shallow trench isolation (STI) structure in a semiconductor substrate.

2. Description of Related Art:

The purpose of an isolation structure in an IC device is to prevent carriers, such as electrons or electron holes, from drifting between two adjacent device elements through a semiconductor substrate to cause a current leakage. For example, carriers drift between two adjacent transistors through their substrate. Conventionally, isolation structures are formed between field effect transistors (FETs) in an IC device, such as a dynamic random access memory (DRAM) device, to prevent a current leakage from occurring. The isolation structures usually are formed directly on the semiconductor substrate. For example, a local oxidation (LOCOS) process is a typical isolation process widely used to form a field oxide (FOX) structure for isolating a metal oxide semiconductor (MOS) transistor. LOCOS technology has been well developed so that it can effectively isolate the MOS transistor with a good reliability of performance and low fabrication cost. However, LOCOS technology still has some problems. One example is an occurrence of a bird's beak on the edge of the FOX structure. The bird's beak reduces the isolation performance when device dimension is reduced. Hence, LOCOS technology is not suitable for a lightly integrated device.

Shallow trench isolation (STI) is another widely used technology for isolating device elements. The 511 structure is particularly suitable for a highly reduced dimension. The STI process usually uses a silicon nitride layer as a mask to form a trench in the substrate by anisotropic etching. Then the trench is filled with an oxide material serving as an isolating structure, which has a top surface as high as the substrate surface. This STI structure allows it to be fabricated with a greatly reduced dimension. Generally, as a device element dimension, such as a transistor dimensions is reduced, the isolation structure dimension is necessary to be accordingly reduced. The STI structure is a good candidates.

However, a conventional STI structure needs a chemical mechanical polish (CMP) process to planarize the oxide matter filled in the trench in order to obtain a planar surface for subsequent fabrication processes. A planarity of a planalized surface depends on many factors such as rotation speed of a polishing pad, slurry supplying rate, global temperature, PH quantity, grind particle size distribution, temperature at the polishing pad, and polishing pad material. If all those factors are not properly optimized during CMP process, different polishing rates may occur at different locations. For instances, a polishing rate at the inner portion of the wafer is larger than that at the outer portion of the wafer. This cause a poor uniformity of the wafer surface. Moreover, a recess also often occurs at the STI structure since it usually includes silicon oxide, which is softer than a mask layer made of silicon nitride. Each device element is isolated by STI structures. Since the device element density at the wafer is not away the same, the wafer usually includes several dense pattern regions and a loose pattern region between two dense pattern regions. Usually, there is only a wider STI structure at the loose patter region to separate the dense pattern regions. The recess effect on the wider STI structure at the loose pattern region is more severe than that at the dense pattern region.

A severe recess effect occurring at the wider STI structure may cause a charge accumulation on each upper corner of the wider STI structure, and further inducing a subthreshold current to shift a device normal threshold voltage. This phenomenon is usually called a kink effect. Moreover, the CMP process also causes a non-uniformity substrate surface.

SUMMARY OF THE INVENTION

It is therefore an objective of the present invention to provide a method for forming a STI structure. A polishing stop is set on an additional polysilicon layer so that a CMP does not cause a STI recess at a loose pattern region and a non-uniformity wafer surface due to the CMI process can also be effectively avoided.

In accordance with the foregoing and other objectives of the present invention, an improved method for forming a STI structure is provided. The improved method includes sequentially forming a pad oxide layer and a mask layer, which preferably includes silicon nitride, on a semiconductor substrate. The mask layer, the pad oxide layer, and the substrate are patterned to form several trenches in the substrate through the mask layer and the pad oxide layer. The trenches includes, for example, a wider trench at a loose pattern region and a narrower trench at dense pattern region. A conformal liner oxide layer is formed on an exposed surface of the substrate in the trenches. An insulating layer is formed over the substrate and an etching back process is performed so that the narrower trench is fully filled but a spacer is formed on each sidewall of the wider trench, the pad oxide layer, and the mask layer. A conformal polysilicon layer is formed over the substrate in which the wider trench is not completely filled yet. An insulating plug is formed to roughly fill the wider trench. Using the insulating plug as an etching mask, a portion of the polysilicon layer is removed by etching. As a result, a polysilicon concave sidewall of the remaining polysilicon layer due to etching may occur. The polysilicon pivot sidewall is filled with polysilicon to compensate the polysilicon pivot sidewall. The mask layer and the pad oxide layer are removed to expose the substrate. A gate oxide layer is formed on a surface of the semiconductor. During the formation of the gate oxide layer, a surface portion of the polysilicon layer is also oxidized so that the insulating plug and the spacer are merged through the oxidized portion of the polysilicon to form a round isolation structure. A STI structure of the invention is formed without recess.

BRIEF DESCRIPTION OF DRAWINGS

The invention can be more fully understood by reading the following detailed description of the preferred embodiment with reference made to the accompanying drawings as follows.

DETAILED DESCRIPTION OF PREFERRED EMBODIMENT

In order to solve the conventional issue of a STI kink effect due to recess, resulting from a chemical mechanical polishing (CMP) process during the formation of a STI structure, a method of the invention uses a polishing stop point at an additional polysilicon layer.

Figure 1A:
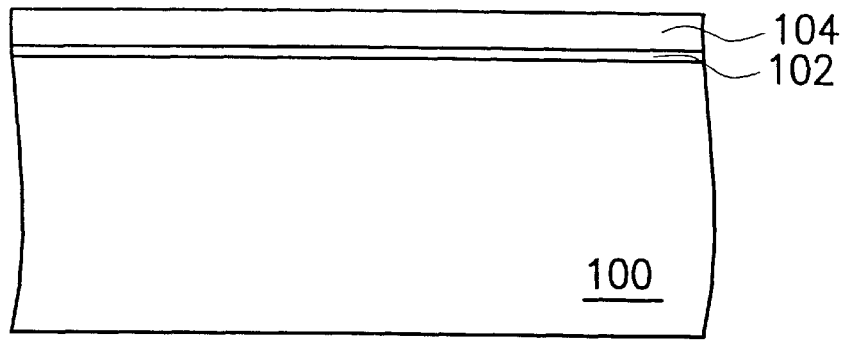
FIGS. 1A–1H are cross-section views of a portion of a substrate, schematically illustrating a fabrication process to form a STI structure, according to a preferred embodiment of the invention.

FIGS. 1A–1H are cross-section views of a portion of a substrate, schematically illustrating a fabrication process to form a STI structure, according to a preferred embodiment of the invention. In FIG. 1A, a pad oxide layer 102 is formed on a semiconductor substrate 100 by thermal oxidation. A mask layer 104 including, for example, silicon nitride is formed on the pad oxide layer 102 by, for example, chemical vapor deposition (CVD), and preferably by low pressure CVD) (LPCVD). The pad oxide layer includes a thickness of about 110 Å, and the mask layer 104 includes a thickness of about 1000 Å–1500 Å.

Figure 1B:
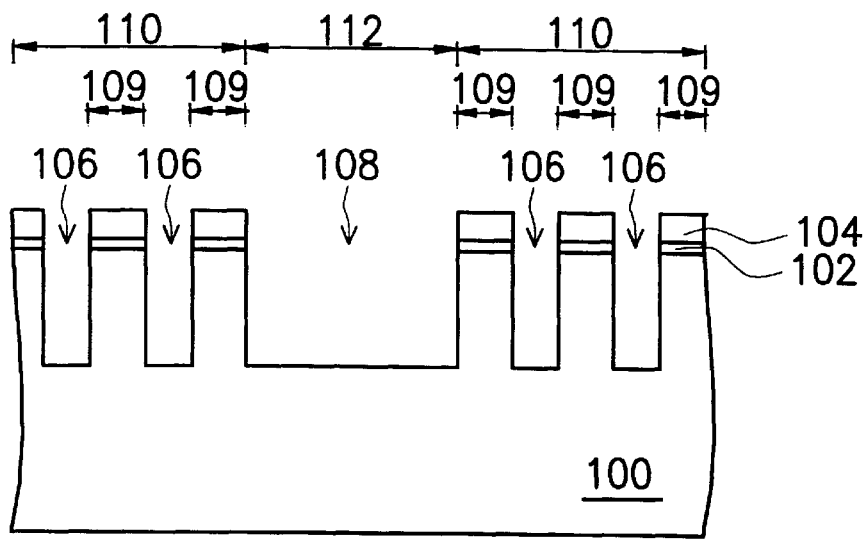

In FIG. 1B, the substrate 100 the pad oxide layer 102, and the mask layer 104 are patterned by, for example, photolithography and etching to form a wider trench 108, and a narrower trench 106. The etching process includes, for example, a plasma anisotropic etching to separately etch the mask layer 104, the pad oxide layer 102, and the substrate 100. The trenches 106, 108 have a depth of about 4000 Å. The trenches 106, 108 define several active areas 109, each of which is enclosed by the trenches 106, 108. Generally, the substrate 100 includes several dense pattern regions 100 and a loose pattern region 112 between the dense pattern regions 110. The dense pattern region 10 typically includes several device elements, such as transistors, which are to be formed on the active areas 109 and are separated by the narrower trench 106. At the loose pattern region 112, there is usually only the wider trench 108 with a sufficient width so as to separate and isolate two dense pattern regions 110. STI structures are to be formed in the trenches 106, 108.

Figure 1C:
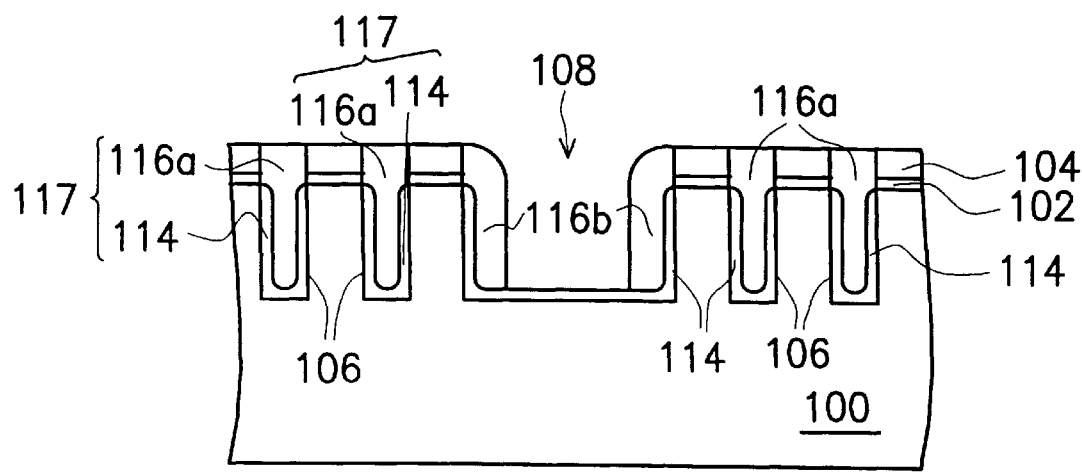

In FIG. 1C a conformal liner oxide layer 114 is formed on an exposed surface of the substrate 100 in the trenches 106, 108. A preliminary first insulating layer is deposited over the substrate 100 by, for example. CVD and an etching back process is performed to remove a portion of the preliminary insulating layer. A remaining portion of the preliminary insulating, layer therefore form a first insulating layer of plug 116a and spacer 116b. The spacer 116b is formed on each sidewall of the wider trench 108, the pad oxide later 102 and the mask layer 104. Since the width of the narrower trench 106 is too small to form a spacer, the plug 116a is formed to fill the narrower trench 106. The liner oxide layer 114 and the plug 116a forms an STI structure 117 in the narrower trench 106.

Figure 1D:
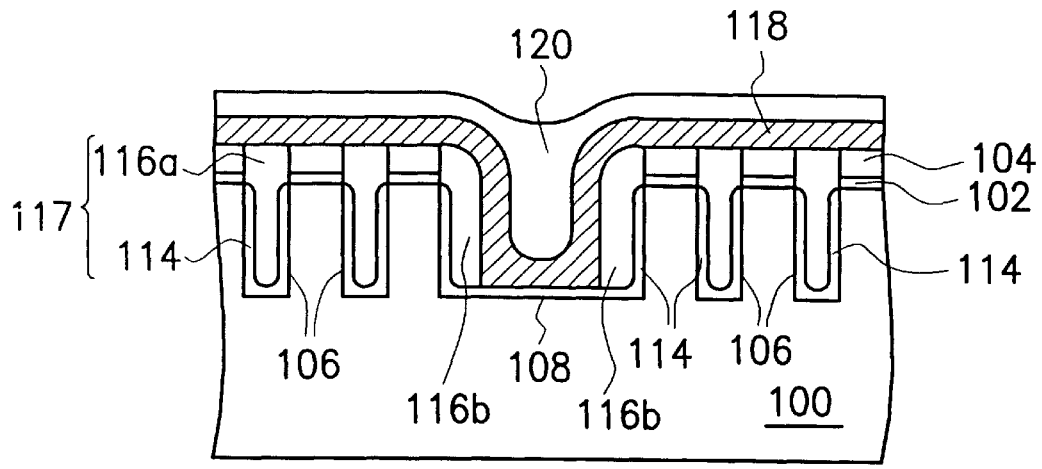

In FIG. 1D a conformal polysilicon layer 118 with a thickness of about 1000 Å–2000 Åis formed over the substrate 100 by, for example, LPCVD. An insulating layer 120 is formed on the polysilicon layer 118 by, for example atmospheric pressure CVD (APCVD) so that the wider trench 108 is fully filled. The insulating layer 120 at a portion within the wider trench 108 includes a thickness of about 8000 Å.

Figure 1E:
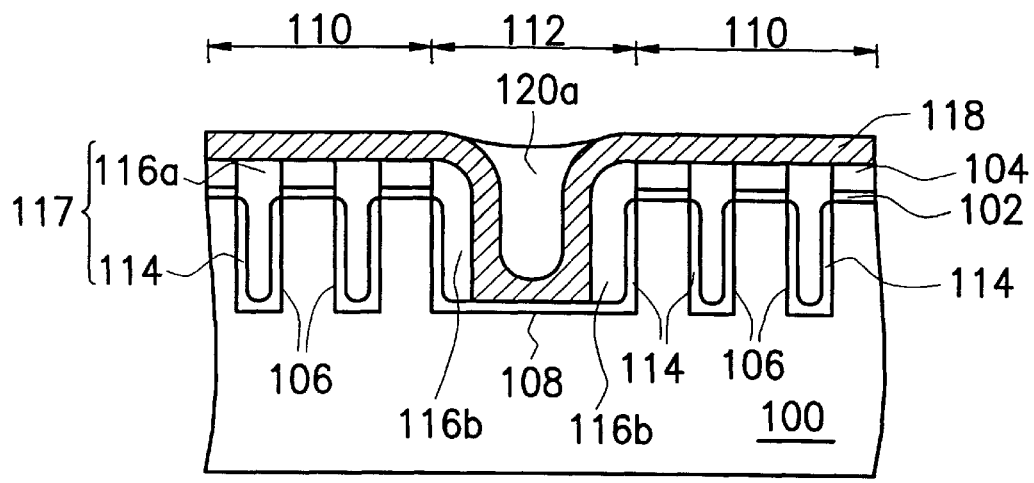

In FIG. 1E, a planarization process, such as a CMP process, is performed to expose the polysilicon layer 118 so that an insulating plug 120a is formed to fill the wider trench 108. Here, the polysilicon layer 118 serves as a polishing stop layer for the CMP process to provide an additional thickness. The insulating plug 120a has about the same height as that of the STI structure 117 or higher. This allows a STI structure to be formed later in the wider trench 108 without recess. Moreover, a non-uniformity surface of the substrate 100 is also effectively avoided since the polysilicon layer 118 provides a more even polishing condition.

Figure 1F:
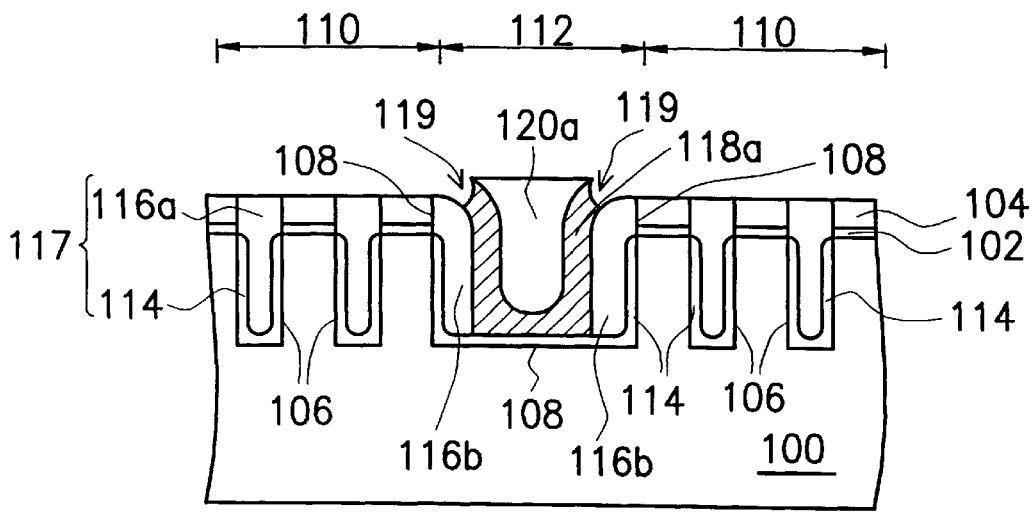

In FIG. 1F, using the insulating plug 120a as an etching mask, a portion of the polysilicon layer 118 is removed by an etching process to expose the STI structure 117 and the mask layer 104. A remaining portion of the polysilicon layer 118 becomes a polysilicon layer 118a. The etching process includes, for example, dry etching or wet etching. After etching, the polysilicon layer 118a may have a pivot 119. In addition, before removing the portion of the polysilicon layer 118 of FIG. 1E, a cleaning process with a HF acid solution may be performed to remove a native oxide layer (not shown), which is formed due to an exposed surface to the air.

Figure 1G:
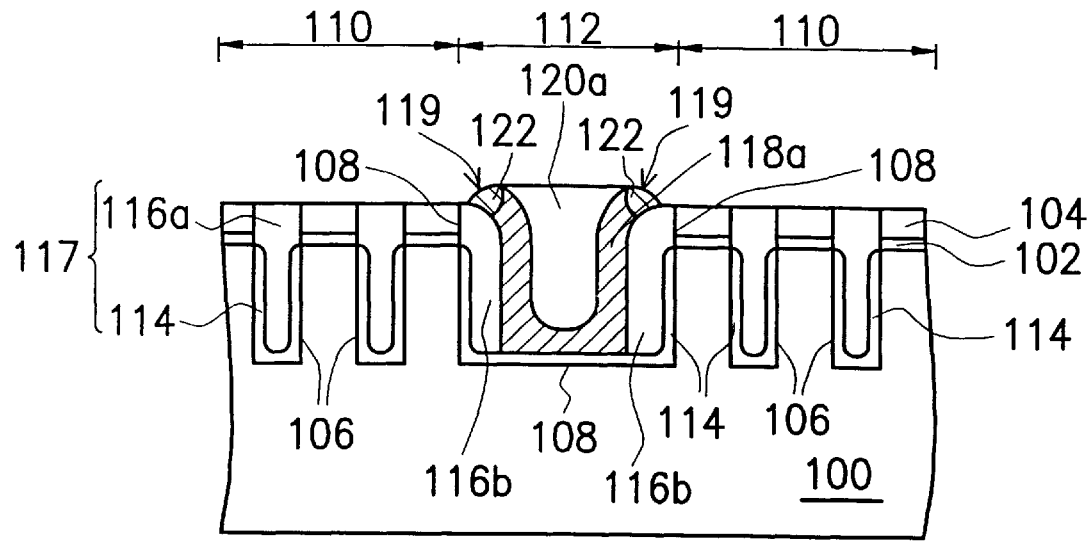

In FIG. 1F and FIG. 1G the pivot 119 of the polysilicon layer 118a is filled with a polysilicon layer 122 by forming a preliminary polysilicon layer over the substrate and performing an etching back process to remove the preliminary polysilicon layer. The height of the STI structure 117 can also be adjusted to a desired height through this etching back process.

Figure 1H:
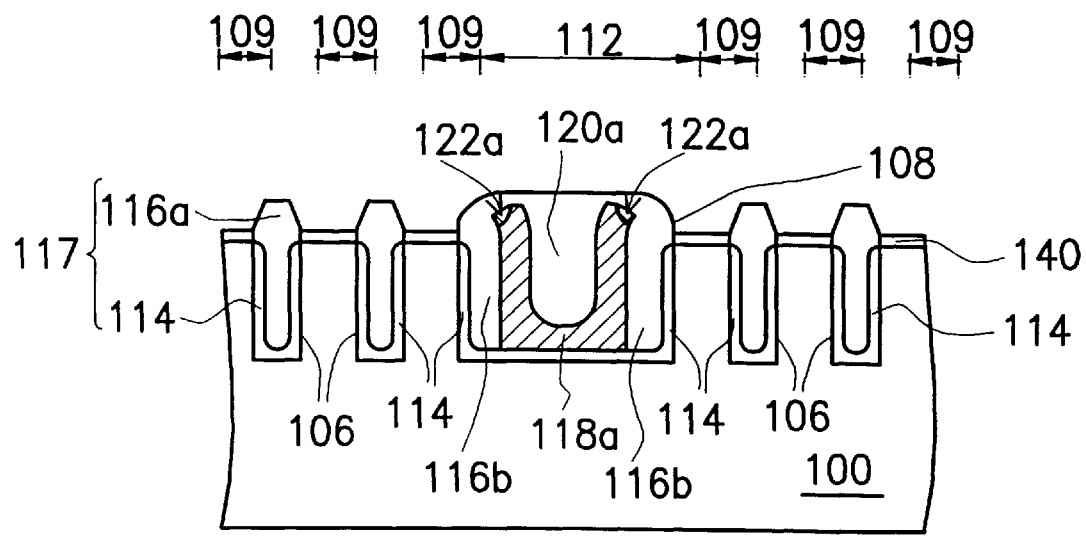

In FIG. 1G, and FIG. 1H, the mask layer 104 and the pad oxide layer are removed to expose the substrate 100 at the active areas 109. A gate oxide layer 140 is formed on the substrate 100 at the active areas 109 through, for example, a thermal oxidation process. During the thermal oxidation process, the polysilicon layer 122 and maybe a portion of the polysilicon layer 118a are simultaneously oxidized to form an oxide object 122a. The insulating plug 120a and the spacer 116b are merged together through the oxide object 122a to completely cover the polysilicon layer 118a with a round surface without recess. A wider STI structure in the wider trench 108 is formed with components of the insulating plug 120a, the oxide object 122a, the polysilicon layer 118a, the liner oxide layer 114, in which the polysilicon layer 118a isolated by the other components 120a, 122a, 114. There is no recess occurring at each upper corner of the wider trench 108 so that a charge accumulation phenomenon does not occur. The conventional kink effect is effectively avoided in the invention.

The structure shown in FIGS. 1A–1H, the pad oxide layer 102, the mask layer 104, and liner oxide layer are not absolutely necessary. The role of the polysilicon layer 118 is still there without them even though they are conventionally formed, for example, to protect the substrate 100.

In conclusion, the invention includes several characteristics as follows:

1. The polysilicon layer 118 is introduced to serve as a polishing stop layer so as to provide an additional thickness to form the insulating plug 120a in the wider trench 108. A recess, which conventionally occurs at each upper corner of the wider trench 108, is effectively avoided so that the kink effect is effectively avoided.

2. The polysilicon layer 118 serving as the polishing stop layer, providing a uniform polishing condition on the substrate 100 so that the CMP process can globally and evenly polish the substrate 100, particularly at the loose pattern region 112. A conventional issue of non-uniformity of the substrate surface is effectively solved. At the dense pattern region 110, the etching back process is used to adjust the height of the STI structure 117 and is relatively to be more easily controlled than the CMP process.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for forming a shallow trench isolation (STI) structure, which is separately formed at a dense patter region and at a loose patter region in a substrate, the method comprising:

forming a first trench in the substrate at the dense pattern region, and a second trench in the substrate at the loose pattern region, in which the first trench is narrower than the second trench;

forming a first insulating layer to fill the first trench, and forming a spacer on each sidewall of the second trench;

forming a conformal first polysilicon layer over the substrate;

forming a second insulating layer on the first polysilicon layer to fill the second trench;

removing an exposed portion of the first polysilicon layer other than under the second insulating layer;

forming a second polysilicon layer on each sidewall of the first polysilicon layer for compensation; and oxidizing the second polysilicon layer and a portion of the first polysilicon layer abutting the second polysilicon layer to form an oxide object, which allows the spacer and the second insulating layer to be merged together to cover the first polysilicon layer, wherein the portion of the first polysilicon layer is not absolutely necessary to be oxidized.

2. The method of claim 1, wherein the step of forming first insulating layer to fill the first trench further comprises:

forming a preliminary insulating layer over the substrate; and performing an etching back process to remove the preliminary insulating layer so that a remaining portion of the preliminary insulating layer fills the first trench to form the first insulating layer, and simultaneously forms the spacer on each sidewall of the second trench due to its wider width.

3. The method of claim 1, wherein the step of forming the second insulating layer comprises:

forming a preliminary second insulating layer over the first polysilicon layer to fill the second trench; and polishing the preliminary second insulating layer until the first polysilicon layer is exposed so that a remaining portion of the preliminary second insulating layer becomes the second insulating layer to fill the second trench.

4. The method of claim 1 wherein the step of removing the exposed portion of the first polysilicon layer comprises dry etching or wet etching.

5. The method of claim 1, wherein the step of forming the second polysilicon layer further comprises:

forming a preliminary second polysilicon layer over the substrate to compensate each sidewall of the first polysilicon layer; and performing an etching process to remove the preliminary second polysilicon layer so that a remaining portion of the preliminary second polysilicon layer abutting each sidewall of the first polysilicon layer to compensate the first polysilicon layer.

6. The method of claim 1 wherein the step of oxidizing the second polysilicon layer comprises a thermal oxidation process.

7. The method of claim 6, wherein during the thermal oxidation process, a gate oxide layer is simultaneously formed on the substrate.

8. A method for forming a shallow trench isolation (STI) structure in a semiconductor substrate, the method comprising:

sequentially forming a pad oxide layer and a mask layer on the substrate;

patterning the a mask layer, the pad oxide layer, and the substrate to form a first trench and a second trench in the substrate, in which the second trench is significantly wider than the first trench, and both the first trench and the second trench comprise a contribution from the pad oxide layer and the mask layer;

forming a first insulating layer to fill the first trench, and forming a spacer on each sidewall of the second trench due to its larger width;

forming a conformal first polysilicon layer over the substrate;

forming a second insulating layer on the first polysilicon layer to fill the second trench;

removing an exposed portion of the first polysilicon layer other than the second insulating layer;

forming a second polysilicon layer on each sidewall of the first polysilicon layer for compensation;

removing the mask layer and the pad oxide layer to expose a portion of the substrate; and oxidizing the second polysilicon layer and a portion of the first polysilicon layer abutting the second polysilicon layer to form an oxide object, which allows the spacer and the second insulating layer to be merged together to cover the first polysilicon layer, wherein the portion of the first polysilicon layer is not absolutely necessary to be oxidized.

9. The method of claim 8, wherein before the step of forming the first insulating layer, the method further comprises forming a liner oxide layer on an inner semiconductor surface of the first trench and the second trench.

10. The method of claim 8, wherein the step of forming the first insulating layer to fill the first trench further comprises:

forming a preliminary insulating layer over the substrate; and performing an etching back process to remove the preliminary insulating layer so that a remaining portion of the preliminary insulating layer fills the first trench to form the first insulating layer, and simultaneously forms the spacer on each sidewall of the second trench due to its wider width.

11. The method of claim 8, wherein the step of forming the second insulating layer comprises:

forming a preliminary second insulating layer over the first polysilicon layer to fill the second trench; and polishing the preliminary second insulating layer until the first polysilicon layer is exposed so that a remaining portion of the preliminary second insulating layer becomes the second insulating layer to fill the second trench.

12. The method of claim 8, wherein the step of removing the exposed portion of the first polysilicon layer comprises dry etching or wet etching.

13. The method of claim 8, wherein the step of forming the second polysilicon layer further comprises:

forming a preliminary second polysilicon layer over the substrate to compensate each sidewall of the first polysilicon layer; and performing an etching process to remove the preliminary second polysilicon layer so that a remaining portion of the preliminary second polysilicon layer abutting each sidewall of the first polysilicon layer to compensate the first polysilicon layer.

14. The method of claim 8, wherein the step of oxidizing the second polysilicon layer comprises a thermal oxidation process.

15. The method of claim 14, wherein during the thermal oxidation process, a gate oxide layer is simultaneously formed on the substrate.

16. A method for forming a shallow trench isolation (STI) structure in a semiconductor substrate, the method comprising:

sequentially forming a pad oxide layer and a mask layer on the substrate;

patterning the a mask layer, the pad oxide layer, and the substrate to form a trench, in which the trench comprises a contribution from the pad oxide layer and the mask layer;

forming a spacer on each sidewall of the trench;

forming a conformal first polysilicon layer over the substrate;

forming an insulating layer on the first polysilicon layer to fill the trench;

removing an exposed portion of the first polysilicon layer other than the insulating layer;

forming a second polysilicon layer on each sidewall of the first polysilicon layer to compensate its sidewall structure;

removing the mask layer and the pad oxide layer to expose a portion of the substrate; and oxidizing the second polysilicon layer and a portion of the first polysilicon layer abutting the second polysilicon layer to form an oxide object, which allows the spacer and the insulating layer to be merged together to cover the first polysilicon layer, wherein the portion of the first polysilicon layer is not absolutely necessary to be oxidized.

17. The method of claim 16, wherein before the step of forming the insulating layer, the method further comprises forming a liner oxide layer on an inner semiconductor surface of the trench and the second trench.

18. The method of claim 16, wherein the step of forming the spacer on each sidewall of the trench further comprises:

forming a preliminary insulating layer over the substrate; and performing an etching back process to remove the preliminary insulating layer so that a remaining portion of the preliminary insulating layer forms the spacer on each sidewall of the trench.

19. The method of claim 16, wherein the step of forming the insulating layer comprises:

forming a preliminary insulating layer over the polysilicon layer to fill the trench; and polishing the preliminary insulating layer until the polysilicon layer is exposed so that a remaining portion of the preliminary second insulating layer becomes the insulating layer to fill the trench.

20. The method of claim 16, wherein the step of removing the exposed portion of the polysilicon layer comprises dry etching or wet etching.

21. The method of claim 16, wherein the step of forming the second polysilicon layer further comprises:

forming a preliminary second polysilicon layer over the substrate to compensate each sidewall of the first polysilicon layer; and performing an etching process to remove the preliminary second polysilicon layer so that a remaining portion of the preliminary second polysilicon layer abutting each sidewall of the first polysilicon layer to compensate the first polysilicon layer.

22. The method of claim 16, wherein the step of oxidizing the second polysilicon layer comprises a thermal oxidation process.

* * * * *